(12) United States Patent
Dierichs

(10) Patent No.: US 7,277,158 B2
(45) Date of Patent: Oct. 2, 2007

(54) LITHOGRAPHIC APPARATUS AND DEVICE MANUFACTURING METHOD

(75) Inventor: Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 158 days.

(21) Appl. No.: 11/001,189

(22) Filed: Dec. 2, 2004

(65) Prior Publication Data

US 2006/0119824 A1    Jun. 8, 2006

(51) Int. Cl.
*G03B 27/54*    (2006.01)
(52) U.S. Cl. .............................. 355/67; 355/70; 355/71
(58) Field of Classification Search .................. 355/67, 355/70, 71
See application file for complete search history.

(56) References Cited

U.S. PATENT DOCUMENTS

| | | | |
|---|---|---|---|
| 6,452,661 B1 | 9/2002 | Komatsuda | 355/67 |
| 6,570,168 B1 | 5/2003 | Schultz et al. | 250/492.2 |
| 2004/0036037 A1 | 2/2004 | Rothweiler et al. | 250/492.2 |
| 2004/0256575 A1* | 12/2004 | Singer et al. | 250/492.2 |

FOREIGN PATENT DOCUMENTS

WO    WO 01/99143 A1    12/2001

* cited by examiner

*Primary Examiner*—D. Rutledge
(74) *Attorney, Agent, or Firm*—Pillsbury Winthrop Shaw Pittman LLP

(57) ABSTRACT

A lithographic projection apparatus includes an illumination system configured to provide a beam of radiation; a support configured to support a patterning device, the patterning device configured to impart the beam of radiation with a pattern in its cross section; a substrate table configured to hold a substrate, and a projection system configured to project the patterned radiation onto a target portion of the substrate. The illumination system includes a plurality of radiation sources; a pupil facet mirror; and a plurality of field facet mirrors, each field facet mirror being associated with one of the radiation sources and each field facet of a given field facet mirror being configured to image the associated source onto one of a plurality of pupil facets on the pupil facet mirror, each pupil facet being adapted to direct the source image received to a predetermined area to form the beam of radiation. To improve image quality, the path length between each field facet and its associated pupil facet is substantially the same for each field/pupil facet pair and the pupil facets have a plurality of different sizes, the size of each depending on a characteristic of the source by which it is illuminated. The radiation sources may emit radiation in the EUV wavelength range.

21 Claims, 2 Drawing Sheets

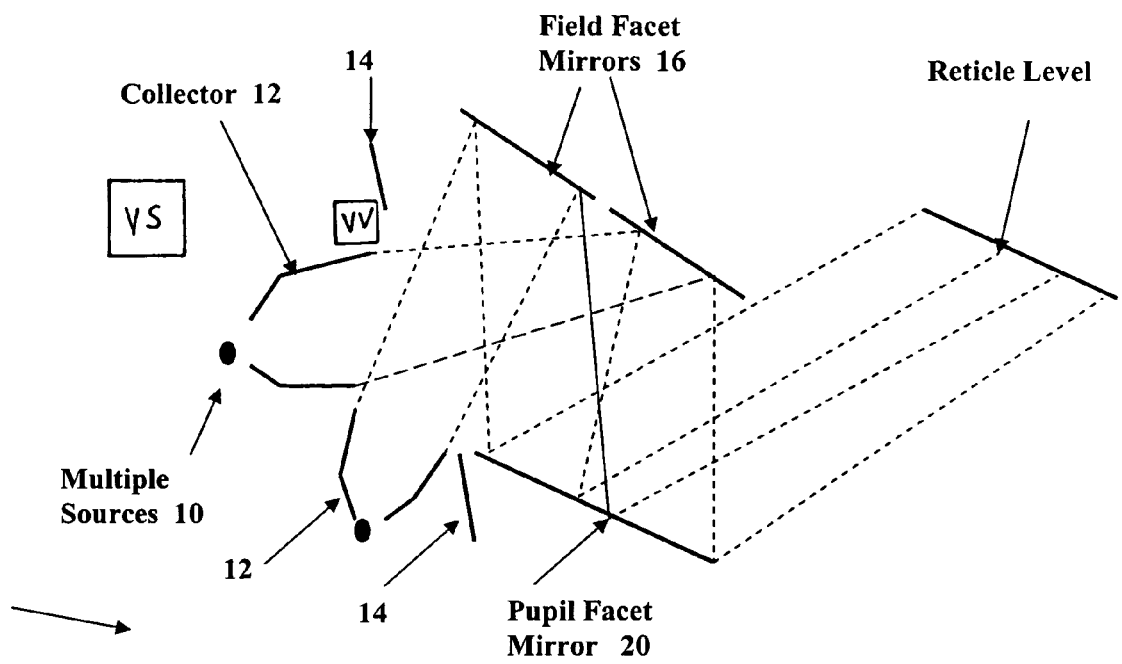
Figure 3
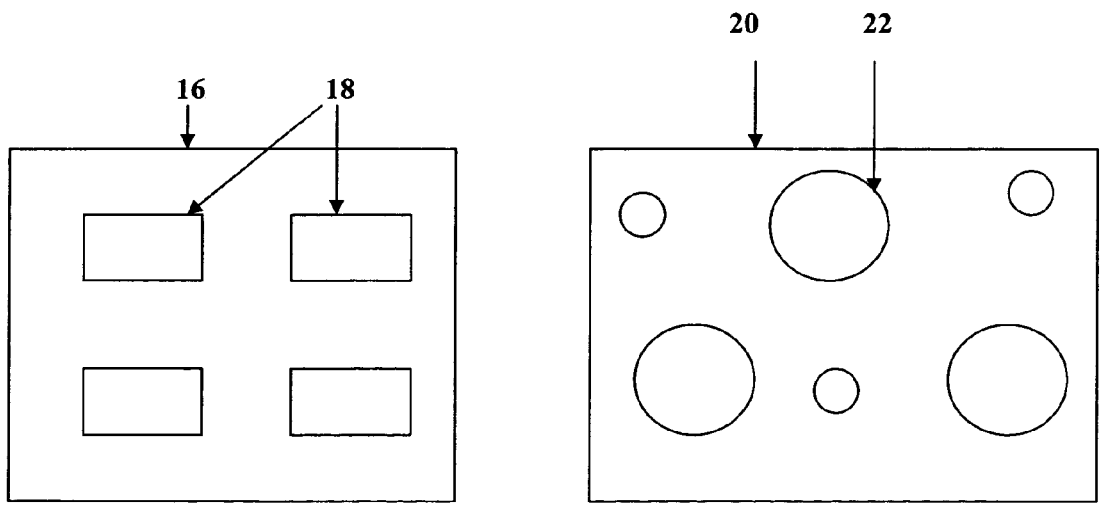
Figure 4
Figure 5

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method for use in a lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In this case, a patterning device, which is alternatively referred to as a mask or a reticle, may be used to generate a circuit pattern corresponding to an individual layer of the IC. This is done using a projection system that is between the reticle and the substrate and is configured to image an irradiated portion of the reticle onto a target portion of a substrate. The projection system includes components to direct, shape and/or control a beam of radiation emitted from a suitable source. The pattern can be imaged onto the target portion (e.g. including part of one or several dies) on a substrate, for example a silicon wafer, that has a layer of radiation-sensitive material, such as resist. In general, a single substrate contains a network of adjacent target portions that are successively exposed.

Known lithographic apparatus include steppers, in which each target portion is irradiated by exposing an entire pattern onto the target portion at once, and scanners, in which each target portion is irradiated by scanning the pattern through the beam of radiation in a given direction, usually referred to as the "scanning" direction, while synchronously scanning the substrate parallel or anti-parallel to this direction. Examples of known systems are described in U.S. Pat. Nos. 6,452,661 and 6,570,168 and U.S. Patent Application Publication 2004/0036037 A1.

A criteria considered in lithography is the size of features of the pattern applied to the substrate. It is desirable to produce apparatus capable of resolving features as small and close together as possible. A number of parameters affect the available resolution of features. One of the most important of these is the wavelength of the radiation used to expose the pattern. Using radiation with an EUV (Extreme Ultra Violet) wavelength between 5 and 20 nm, and typically 13.5 nm, it is anticipated that it will be possible to manufacture of feature sizes down to 32 nm.

Various EUV sources are known. For example, some plasma-based radiation sources emit radiation in this wavelength range. These sources are generally volume radiators, i.e. they simultaneously emit radiation in all directions. Plasma sources include a discharge medium that can be stimulated to form a plasma and emit radiation either by using suitable laser radiation or by using an electrical discharge. These sources come in many different forms and use many different materials for the discharge medium. Examples of suitable discharge materials include xenon, lithium, tin and indium. At low pressure and relatively high voltages, a discharge can be initiated to develop a high-density plasma region. Injecting an intense beam of electrons into this region causes compression of the plasma and ultimately results in the kinetic energy of the plasma being fully converted into thermal energy and finally electromagnetic radiation having wavelengths in the EUV range. Examples of plasma sources are described in WO 01/99143.

While using wavelengths in the EUV range allows for the fabrication of very small features, it can cause practical problems. Radiation at this wavelength is absorbed in all materials and is therefore not suitable for use with refractive optics. Therefore, the optics in a projection system for use with EUV lithography must be based on mirrors, which can only operate in an ultra high vacuum (UHV) environment. A further problem is that the conversion efficiency, i.e. the ratio of power out at the required wavelength to power in, for discharge sources is very low, which means that the radiation power output is correspondingly low. While the systems described in U.S. Pat. No. 6,570,168 and U.S. Patent Application Publication 2004/0036037 A1 address some of these issues, their physical construction is relatively complex.

SUMMARY OF THE INVENTION

According to one aspect of the present invention, a lithographic projection apparatus includes an illumination system configured to provide a beam of radiation; a support configured to support a patterning device, the patterning device configured to impart the beam of radiation with a pattern in its cross section; a substrate table configured to hold a substrate, and a projection system configured to project. the patterned beam of radiation onto a target portion of the substrate, wherein the illumination system includes a plurality of radiation sources; a pupil facet mirror; and a plurality of field facet mirrors, each field facet mirror being associated with one of the radiation sources and each field facet of a given field facet mirror being configured to image the associated source onto one of a plurality of pupil facets of the pupil facet mirror, each pupil facet being adapted to direct the source image received to a predetermined area to form the beam of radiation, wherein an optical path length between each field facet and its corresponding pupil facet is substantially the same for all field facet and pupil facet pairs, all the field facets have substantially the same optical power and all the pupil facets have substantially the same optical power.

By ensuring that the path length between each field facet and its corresponding pupil facet is substantially the same for all field/pupil facet pairs, all the field facets have substantially the same optical power and all the pupil facets have about the same optical power, the construction of the field and pupil mirrors can be made relatively simple, while providing a good quality increased power radiation beam without the need for moving parts and/or complicated electronics. Because a plurality of sources N is used, if one source misses a pulse, the single pulse error is only 1/N. By ensuring a correct mixing of the facets, this effect is almost negligible in the pupil plane and so for imaging.

The pupil facets may have a plurality of different sizes, the size of each depending on a characteristic of the source by which it is illuminated. The characteristic of the source may be its size when imaged in the pupil plane.

The radiation sources may be EUV sources having a wavelength in the range of 5-20 nm. The sources may also be plasma sources.

The illumination system of the lithographic apparatus may be operated under vacuum conditions. A separation frame may be provided to selectively isolate a selected one of the sources from the rest of the illumination system. The maintenance work may then be done on the selected source without having to close down the rest of the system.

According to another aspect of the invention, a device manufacturing method includes providing a beam of radiation; patterning the beam of radiation; and projecting the patterned beam of radiation onto a target portion of a substrate, wherein providing the beam of radiation includes providing radiation from a plurality of radiation sources; imaging each radiation source from an associated field facet mirror including a plurality of field facets onto respective pupil facets of a pupil facet mirror; and directing the associated source images to a predetermined area to form the beam of radiation, wherein an optical path length between each field facet and its corresponding pupil facet is substantially the same, all the field facets have substantially the same field facet optical power and all the pupil facets have substantially the same pupil facet optical power.

The pupil facets may have a plurality of different sizes, the size of each depending on a characteristic of the source by which it is illuminated. The characteristic of the source may be its size when imaged in the pupil plane.

The radiation sources may be EUV sources having a wavelength in the range of 5-20 nm. The sources may also be plasma sources.

The method may also include operating under vacuum conditions. The method may further include selectively isolating one of the sources from the vacuum condition.

According to yet another aspect of the invention, a lithographic projection apparatus includes an illumination system configured to provide a beam of radiation; a support configured to support a patterning device, the patterning device configured to impart the beam of radiation with a pattern in its cross section; a substrate table configured to holding a substrate, and a projection system configured to project the patterned beam of radiation onto a target portion of the substrate, wherein the illumination system includes a plurality of radiation sources; a pupil facet mirror; and a plurality of field facet mirrors, each field facet mirror being associated with one of the radiation sources and each field facet of each field facet mirror being configured to image the associated source onto one of a plurality of pupil facets of the pupil facet mirror, each pupil facet being adapted to direct the source image received to a predetermined area to form the beam of radiation, wherein the pupil facets have a plurality of different sizes, the size of each depending on a characteristic of the source by which it is illuminated.

By varying the size of the pupil facets, these can be chosen to maximize the power in the radiation beam. This is because the source radiation profile is anisotropic. For example, the characteristic of the source that is used to select the size of the pupil facet may be the size of the source when imaged in the pupil plane. This provides a simple and effective mechanism for providing a good quality increased power radiation beam without the need for moving parts and/or complicated electronics. Because a plurality of sources are used, if one source out of N sources misses a pulse, the single pulse error is only 1/N. By ensuring a correct mixing of the facets, this effect is almost negligible in the pupil plane and so for imaging.

The characteristic of the source may be its size when imaged in a plane in which the pupil mirror lies.

An optical path length between each field facet and its corresponding pupil facet may be substantially the same for all field/pupil facet pairs, all the field facets may have substantially the same optical power and all the pupil facets may have substantially the same optical power.

The radiation sources may be EUV sources having a wavelength in the range of 5-20 nm. The sources may be plasma sources.

The illumination system of the lithographic apparatus is usually operated under vacuum conditions. A separation frame may be provided to selectively isolate one of the sources from the rest of the illumination system. This means that maintenance work can be done on the selected source without having to close down the rest of the system.

According to another aspect of the invention, a device manufacturing method includes providing a beam of radiation; patterning the beam of radiation; and projecting the patterned beam of radiation onto a target portion of a substrate, wherein providing the beam of radiation includes providing radiation from a plurality of radiation sources; imaging each radiation source from an associated field facet mirror including a plurality of field facets onto respective pupil facets of a pupil facet mirror; and directing the associated source images to a predetermined area to form the beam of radiation, wherein the pupil facets have a plurality of different sizes, the size of each depending on a characteristic of the source by which it is illuminated.

The characteristic of the source may be its size when imaged in a plane in which the pupil mirror lies.

The radiation sources may be EUV sources having a wavelength in the range of 5-20 nm. The sources may be plasma sources.

The method may include operating under a vacuum condition. The method may further include selectively isolating one of the sources from the rest of the illumination system.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to devices that can be used to impart to a beam of radiation a pattern over its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

The patterning device may be transmissive or reflective. The patterning device may include any of masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, e.g. bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation of radiation, and such components may also be referred to below, collectively or singularly, as a "lens".

The lithographic apparatus may be of a type having two (dual stage) or more substrate tables (and/or two or more mask tables). In such multiple stage machines the additional tables may be used in parallel, or preparatory processes may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 3 is a schematic diagram of an illumination system for use in the apparatus of FIG. 2;

FIG. 4 is a front view of a field facet mirror for use in the illumination system of FIG. 3, and FIG. 5 is a front view of a pupil facet mirror for use in the illumination system of FIG. 3.

DETAILED DESCRIPTION

Figure 1:
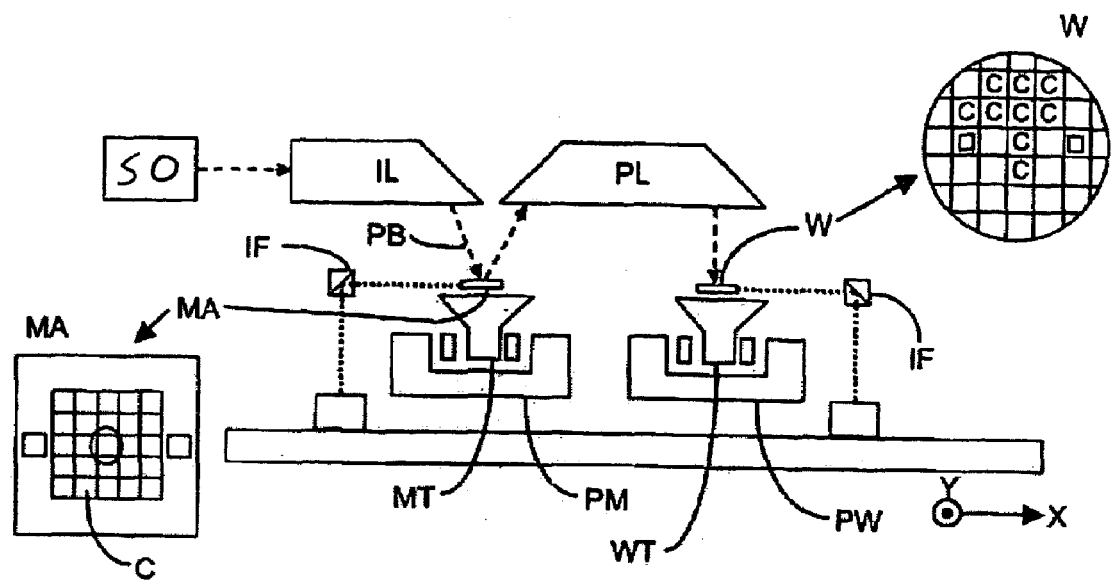
FIG. 1 is a schematic diagram of a lithographic apparatus according to an embodiment of the present invention.
Figure 2:
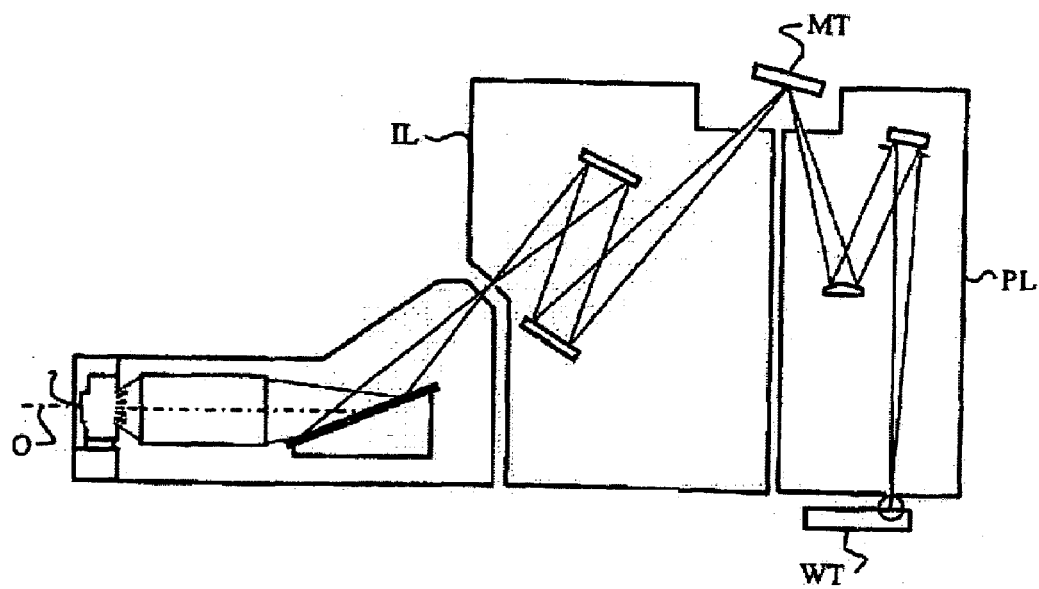
FIG. 2 is a more detailed view of parts of the apparatus of FIG. 1.

FIGS. 1 and 2 show a lithographic apparatus including an illumination system (illuminator) IL configured to provide a beam of radiation PB (e.g. UV or EUV radiation). A support (e.g. a mask table) MT is configured to support a patterning device (e.g. a reticle or mask) MA and connected to first positioning device PM that accurately positions the patterning device with respect to a projection system PL. A substrate table (e.g. a wafer table) WT is configured to hold a substrate (e.g. a resist-coated wafer) and is connected to a second positioning device that accurately positions the substrate with respect to the projection system PL. The projection system (e.g. a reflective projection lens) PL is configured to image a pattern imparted to the beam of radiation PB by patterning device MA onto a target portion C (e.g. including one or more dies) of the substrate W. The apparatus of FIG. 1 is of a reflective type, for example employing a reflective mask or a programmable mirror array of a type as referred to above. However, it will be appreciated that the apparatus may be of a transmissive type, for example employing a transmissive mask.

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases the source may be integral part of the apparatus, for example when the source is a mercury lamp.

The illuminator IL provides a conditioned beam of radiation PB having a desired uniformity and intensity distribution in its cross-section. This beam PB is incident on the mask MA, which is held on the mask table MT. Being reflected by the mask MA, the beam of radiation PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used various modes. For example, in step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure. In a scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de)magnification and image reversal characteristics of the projection system PL. In scan mode, the maximum size of the exposure field limits the width, in the non-scanning direction, of the target portion in a single dynamic exposure, whereas the length of the scanning motion determines the height, in the scanning direction, of the target portion. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above. Combinations and/or variations on these various modes described or entirely different modes of use may also be employed.

FIG. 3 shows in more detail a radiation source SO and an illumination system IL for use in the lithographic apparatus of FIGS. 1 and 2. In order to provide a beam of radiation having a relatively high power, the radiation system SO of FIG. 3 includes a plurality of EUV radiation sources 10, for example plasma discharge sources. Although not shown in FIG. 3, it is desirable that four sources 10 are used, and that these are positioned as close as possible to each other to minimize the space that they take up. Associated with each source 10 is a collector 12 to direct radiation towards the illumination system IL. Between the collector 12 and the illumination system IL is a separation frame 14 including a vacuum valve VV which is selectively operable to isolate a selected one of the sources from a vacuum condition created in the illumination system by a vacuum source VS so that the selected source can be removed for maintenance purposes or worked on in situ. It should be appreciated the multiple separation frames and vacuum valves may be used.

Included in the illumination system IL is a plurality of physically distinct field facet mirrors 16, each mirror 16 being associated with one of the sources 10, and a planar pupil facet mirror 20. Each field facet mirror 16 may be planar and include a plurality of field facets 18 defined on it, as shown schematically in FIG. 4. Alternatively, the plurality of field facet mirrors 16 may be provided as separate regions or areas of a single mirror, each region being associated with one of the plurality of sources 10. Each field facet 18 includes a small mirror that may be planar or slightly curved. Each field facet 18 may have substantially the same optical power. The field facets 18 are shaped and positioned so that they each are able to provide an image of their associated sources. In addition, each field facet 18 is sized to have the scale of the desired field size at the reticle level. Typically the field facet 18 does not have exactly the same dimensions as the desired field in the reticle plane, although this is possible. Instead, more usually, the exact dimensions of the field are created by relay optics (not shown).

Facing the field facet mirrors 16 is a planar pupil facet mirror 20 having a plurality of pupil facets 22 provided thereon, as shown schematically in FIG. 5. Each pupil facet 22 includes a small mirror that may be planar or slightly curved. Each pupil facet may have substantially the same optical power, which may or may not be different from that of the field facets. Each of the plurality of field facet mirrors 16 is positioned to direct radiation towards the pupil facet mirror 20, and each field facet 18 of the field facet mirrors 16 is associated with its own individual, designated pupil facet 22. The field and pupil facets 18 and 22 respectively are positioned, for example tilted, so that a source image from each field facet 18 is directed onto its designated pupil facet 22. Each pupil facet 22 is positioned and adapted to direct images incident thereon towards a predetermined area, in the case of FIG. 3, a reticle. In this way, images of the sources 10 from each of the field facets 18 are combined via the pupil facets 22 to provide a beam of radiation. Arranging the pupil facets in this way results in the mixing of the light that enters the illumination system IL, thereby creating a uniform field distribution. Because all the field facets have substantially the same optical power and all the pupil facets have substantially the same optical power, the path length between each field facet 18 and its corresponding pupil facet 22 should be substantially the same for all field and pupil facet pairs. This particular combination of features makes the construction of the field and pupil mirrors simpler.

To optimize for the highest efficiency, an optimization simulation can be done to establish how many field facets 18 are needed, and how the field facets 18 and pupil facets 22 should be positioned relative to each other in order to have the highest uniformity. Various techniques for doing this are known and so will not be described in detail. For example, for a four-source system, optimum imaging may be achieved if each source illuminates two pupil facets 22. This means that the field facet mirror 16 for each source 10 has to have two facets 18, each one for imaging the source 10 onto one of the pupil facets 22. To optimize image quality further, the size of the pupil facets is selected depending on which part of the source it is illuminated from. Based on modelling and/or experimentation, the actual etendu at the proposed location of the pupil facet can be calculated. Using this, the size of the pupil facet can be determined. For example, the pupil facet size may be selected to be the same size as the source size in the pupil plane, or slightly larger to take into account adjustment tolerances. This allows variations in the etendu of the source radiation to be taken into account, thereby resulting in better filling of the pupil facet mirror. This is useful because in practice, sources such as EUV sources are outputs that are not perfectly symmetric or uniform. Ideally, the size of each pupil facet should be optimized to ensure that energy distribution is as uniform as possible over the pupil facet area.

As will be appreciated, light distribution at the field facet mirrors 16 is inhomogeneous and so the distribution at the pupil facet mirror 20 is also inhomogeneous. Because it is desirable for imaging that the pupil distribution be as homogeneous as possible, two neighboring field facets will typically not point to two neighboring pupil facets. For example, the field facet 16 at the top of the field facet mirror 16 may illuminate a pupil facet 22 in the center of the pupil facet mirror 20 while the field facet 18 immediately below may illuminate a pupil facet 22 at the left side of the pupil facet mirror 20. Randomizing the relationships between adjacent field facets 18 and their corresponding pupil facets 22 decouples images at the field plane, which improves the image quality in the pupil plane. To achieve this randomizing effect, typically all the facets have different tilts with respect to their immediate neighbors to make sure that each field facet illuminates the correct pupil facet and that the image in the pupil plane is decoupled from images that are physically adjacent in the field plane. In practice, this means that the pupil facets 22 are also tilted at different angles to make sure that they are all able to receive light from the correct field facet 18 and direct the images of the plurality of sources to the same field position.

The number of facets provided on each of the mirrors 16, 20 should desirably be as many pupil facets 22, and a corresponding total number of field facets 18, as possible so that as many images as possible can be added. However, in practice, the number of facets is limited by the etendu of the source 10, the physical space limitations inside the apparatus and fabrication limitations. While making the pupil facet mirror 20 bigger to accommodate more facets is one option, typically this is not possible within the limited space that is available within the illumination system IL. Hence, for a source 10 with a large etendu, typically fewer pupil facets 22 are possible in a given area, whereas for a source with a small etendu more facets 22 are possible within the same area.

It will be appreciated that departures from the above-described embodiments may still fall within the scope of the invention. For example, while FIGS. 4 and 5 show highly schematic views of the field and pupil facet mirrors, it should be appreciated that the actual form of these and the facets thereon may look different in practice. Various shapes and configurations for field and pupil facets are well known in the art, such as those described in U.S. Pat. No. 6,570,168 and U.S. Patent Application Publication 2004/0036037 A1, and so are not described herein in detail. In addition, although specific reference is made in this text to the use of lithographic apparatus in the manufacture of ICs, it should be understood that the lithographic apparatus may have other applications, such as the manufacture of integrated optical systems, guidance and detection patterns for magnetic domain memories, liquid crystal displays (LCDs), thin film magnetic heads, etc. Also, it should be appreciated that in the context of such alternative applications, any use of the terms "wafer" herein may be considered synonymous with the more general term "substrate". In addition, the substrate referred to herein may be processed before or after exposure, in for example, a track (a tool that typically applies a layer of resist to a substrate and develops the exposed resist) or a metrology or inspection tool. Furthermore, the substrate may be processed more than once, for example, in order to create a multi-layer IC, so that the term substrate used herein may also refer to a substrate that already contains multiple processed layers. Also, while the lithographic apparatus described includes a reflective reticle and a projection system including reflective elements, a transmissive reticle and/or elements in the projection system may also be used. Furthermore, the apparatus has been described for use with EUV radiation but it should be appreciated that radiation of other wavelengths may also be used.

While specific embodiments of the present invention have been described above, it will be appreciated that the present invention may be practiced otherwise than as described. The description is not intended to limit the invention.

What is claimed is:

1. A lithographic projection apparatus, comprising:
   an illumination system configured to provide a beam of radiation;
   a support configured to support a patterning device, the patterning device configured to impart the beam of radiation with a pattern in its cross section;
   a substrate table configured to hold a substrate; and
   a projection system configured to project the patterned beam of radiation onto a target portion of the substrate, wherein
   the illumination system comprises
      a pupil facet mirror; and
      a plurality of field facet mirrors, each field facet mirror being associated with one of a plurality of radiation sources and each field facet of a given field facet mirror being configured to image the associated source onto one of a plurality of pupil facets of the pupil facet mirror, each pupil facet being adapted to direct the source image received to a predetermined area to form the beam of radiation, wherein an optical path length between each field facet and its corresponding pupil facet is substantially the same for all field facet and pupil facet pairs, all the field facets have substantially the same optical power and all the pupil facets have substantially the same optical power.

2. An apparatus according to claim 1, wherein the radiation sources are EUV sources having a wavelength in the range of 5-20 nm.

3. An apparatus according to claim 1, further comprising:
   a separation frame in the illumination system configured to selectively isolate one of the radiation sources from the rest of the illumination system.

4. An apparatus according to claim 3, further comprising:
   a vacuum source configured to create a vacuum condition in the illumination system; and
   a vacuum valve operatively associated with the separation frame and configured to selectively isolate the selected source from the vacuum condition in the illumination system.

5. An apparatus according to claim 1, wherein the pupil facets have a plurality of different sizes depending on a characteristic of the source by which it is illuminated.

6. A device manufacturing method, comprising:
   providing a beam of radiation;
   patterning the beam of radiation; and
   projecting the patterned beam of radiation onto a target portion of a substrate, wherein providing the beam of radiation comprises
      providing radiation from a plurality of radiation sources;
      imaging each radiation source from an associated field facet mirror including a plurality of field facets onto respective pupil facets of a pupil facet mirror; and
      directing the associated source images to a predetermined area to form the beam of radiation, wherein an optical path length between each field facet and its corresponding pupil facet is substantially the same, all the field facets have substantially the same field facet optical power and all the pupil facets have substantially the same pupil facet optical power.

7. A method according to claim 6, wherein the radiation sources are EUV sources having a wavelength in the range of 5-20 nm.

8. A method according to claim 6, further comprising:
   operating the radiation sources under a vacuum condition.

9. A method according to claim 8, further comprising:
   selectively isolating one of the sources from the vacuum condition.

10. A method according to claim 6, wherein the pupil facets have a plurality of different sizes depending on a characteristic of the source by which it is illuminated.

11. A lithographic apparatus, comprising:
    an illumination system configured to provide a beam of radiation;
    a support configured to support a patterning device, the patterning device configured to impart the beam of radiation with a pattern in its cross section;
    a substrate table configured to hold a substrate; and
    a projection system configured to project the patterned beam of radiation onto a target portion of the substrate, wherein
    the illumination system comprises
       a pupil facet mirror; and
       a plurality of field facet minors, each field facet mirror being associated with one of a plurality of radiation sources and each field facet of each field facet mirror being configured to image the associated source onto one of a plurality of pupil facets of the pupil facet mirror, each pupil facet being adapted to direct the source image received to a predetermined area to form the beam of radiation, wherein the pupil facets have a plurality of different sizes, the size of each depending on a characteristic of the source by which it is illuminated.

12. An apparatus according to claim 11, wherein two sources and two corresponding field facet mirrors are provided.

13. An apparatus according to claim 11, wherein each field facet mirror has two field facets.

14. An apparatus according to claim 11, wherein the radiation sources are EUV sources having a wavelength in the range of 5-20 nm.

15. An apparatus according to claim 11, wherein the radiation sources are plasma sources.

16. An apparatus according to claim 11, further comprising a separation frame configured to selectively isolate one of the radiation sources from the rest of the illumination system.

17. An apparatus according to claim 16, further comprising:
- a vacuum source configured to create a vacuum condition in the illumination system; and
- a vacuum valve operatively associated with the separation frame and configured to selectively isolate the selected source from the vacuum condition in the illumination system.

18. An apparatus according to claim 11, wherein an optical path length between each field facet and its corresponding pupil facet pair is substantially the same for all field facet and pupil facet pairs, all the field facets have substantially the same optical power and all the pupil facets have substantially the same optical power.

19. An apparatus according to claim 11, wherein the characteristic of the source is its size when imaged in a plane in which the pupil facet mirror lies.

20. A device manufacturing method including:
providing a beam of radiation;
patterning the beam of radiation; and
projecting the patterned beam of radiation onto a target portion of a substrate, wherein providing the beam of radiation comprises
  providing radiation from a plurality of radiation sources;
  imaging each radiation source from an associated field facet mirror including a plurality of field facets onto respective pupil facets of a pupil facet mirror; and
  directing the associated source images to a predetermined area to form the beam of radiation, wherein the pupil facets have a plurality of different sizes, the size of each depending on a characteristic of the source by which it is illuminated.

21. A method according to claim 20, wherein the radiation sources are EUV sources having a wavelength in the range of 5-20 nm.

* * * * *